United States Patent

Sumi et al.

[11] Patent Number: 6,022,798
[45] Date of Patent: Feb. 8, 2000

[54] METHOD OF FORMING AN INTERCONNECT USING THIN FILMS OF TI AND TIN

[75] Inventors: Hirofumi Sumi; Chigusa Yamane, both of Kanagawa, Japan

[73] Assignee: Sony Corporation, Japan

[21] Appl. No.: 08/752,168

[22] Filed: Nov. 18, 1996

Related U.S. Application Data

[62] Division of application No. 08/495,765, Jun. 26, 1995, abandoned.

[30] Foreign Application Priority Data

Jun. 28, 1994 [JP] Japan ..................... 6-169028

[51] Int. Cl.[7] .................................................. H01L 29/54
[52] U.S. Cl. .......................... 438/637; 438/643; 438/649; 438/668; 438/680
[58] Field of Search ..................... 438/656, 649, 438/643, 653, 637, 648, 668, 680, 683, 685

[56] References Cited

U.S. PATENT DOCUMENTS

| | | | |
|---|---|---|---|
| 4,822,753 | 4/1989 | Pintchovski et al. | 438/192 |
| 4,884,123 | 11/1989 | Dixit et al. | 357/71 |
| 4,897,709 | 1/1990 | Yokoyama et al. | 357/68 |
| 4,994,410 | 2/1991 | Sun et al. | 438/192 |
| 5,049,975 | 9/1991 | Ajika et al. | 357/71 |
| 5,202,579 | 4/1993 | Fujii et al. | 257/751 |
| 5,231,055 | 7/1993 | Smith | 438/192 |
| 5,290,731 | 3/1994 | Sugano et al. | 438/174 |
| 5,356,835 | 10/1994 | Smoekh et al. | 438/192 |
| 5,444,018 | 8/1995 | Yost et al. | 438/190 |
| 5,508,066 | 4/1996 | Akahori | 427/571 |

*Primary Examiner*—Wael Fahmy
*Assistant Examiner*—Kurt Eaton
*Attorney, Agent, or Firm*—Rader, Fishman & Grauer; Ronald P. Kananen

[57] ABSTRACT

A semiconductor device has a semiconductor layer such as of Si, an insulator film formed on the semiconductor layer and having a contact hole formed therein, a first contacting layer such as of Ti formed in the contact hole so as to be in contact with the semiconductor layer, a second contacting layer such as of TiN formed on the first contact material, and a contacting material such as W formed on the second contacting layer so as to substantially fill the contact hole. The first contacting layer in as formed state has a thickness of 4 nm or greater, while the second contacting layer as formed has a thickness of 1 nm or greater. The optimum thicknesses of the contacting layers are determined based on the pattern rule, e.g., 3.5 m rule, and the kinds of the materials such as Ti, TiN and W. Electrically stable ohmic contact can be obtained at a high yield.

13 Claims, 7 Drawing Sheets

METHOD OF FORMING AN INTERCONNECT USING THIN FILMS OF TI AND TIN

This application is a division of application Ser. No. 08/495,765 filed Jun. 26, 1995 now abandoned.

BACKGROUND OF THE INVENTION

1. Field of the Invention

The present invention relates to a semiconductor device having an interconnect and, more particularly, to a semiconductor device which is suitable for use in various semiconductor technologies requiring high degrees of integration and fineness of semiconductors.

2. Description of Related Art

In the field of semiconductor technology, there is a trend towards a greater scale of integration of semiconductor devices, requiring shallower interconnect structures and, at the same time, finer contact holes with greater depths.

A description will now be given, by way of example, as to a semiconductor process, and particularly to production of a MOSFET, with specific reference to FIGS. 12 to 14.

Step (a):

Referring first to FIG. 12, a device isolation region 12 (local oxidation of silicon, referred to as "LOCOS $SiO_2$") and a gate region are formed on a semiconductor substrate (silicon) denoted by 1. The gate region includes a gate material 15 (polysilicon, polycide or the like), a gate insulation film 17 ($SiO_2$) and a gate side wall denoted by 16a, 16b. This structure is obtained by effecting ion implantation to form a lightly doped drain region (referred to as "LDD region") 14a, 14b, forming the gate side wall 16a, 16b, and effecting ion implantation to form source/drain regions 13a, 13b.

Step (b):

Then, an interlayer insulator 18 is formed by, for example, a spin-on-glass technique (referred to as "SOG"), chemical vapor deposition (referred to as "CVD") of $SiO_2$, or $SiO_2$ formation by using TEOS ($Si(OC_2H_5)_4$), followed by formation of a wiring contact hole 19, whereby a structure as shown in FIG. 13 is obtained.

Step (c):

Then, a TiN/Ti laminate film is laid by sputtering and a metal plug 23 as an embedded contact material is formed. In this case, tungsten (W) is used as the buried material 23. Then, although not shown, a dual layer of Al-Si/Ti is deposited over the whole surface, followed by a patterning. The TiN/Ti layer underlying W is designated by numeral 20. A wiring region is thus formed, whereby a structure as shown in FIG. 14 is obtained.

In the process described above, it is necessary to remove, in advance of the formation of the metal plug 23 in the contact hole 19, the native oxide film formed on the silicon (Si) substrate 1. The removal of such an oxide film is typically performed by using diluted fluoric acid. However, the aforementioned trend towards a greater degree of fineness and a higher aspect ratio of the contact hole 19 makes it difficult to charge the contact hole 19 with diluted fluoric acid of a quantity large enough to remove the native oxide film inside the contact hole, resulting in imperfect removal of the oxide film. This causes an imperfect filling of the contact hole 19, allowing defects such as the generation of voids, thus causing a failure to provide satisfactory ohmic contact between the metal plug 23 and the silicon substrate which serves as a semiconductor layer, resulting in an increase in the wiring resistance. Since the interlayer insulator 18 in which the contact hole 19 is formed is mainly constituted by an oxide film, the interlayer insulator 18 also is etched isotropically during the treatment with the diluted fluoric acid, tending to reduce the thickness of the interlayer insulator 18. Such an isotropic etching effect also enlarges the contact hole 19, thus causing an impediment to the controllability of delicate and fine processing.

A non-wet etching technique using, for example, hydrogen fluoride (referred to as "HF") vapor has been proposed and discussed as being one measure for eliminating these problems. However, etching relying on HF vapor is basically a chemical reaction and, hence, proceeds isotropically as in the case of wet etching. This solution therefore is ineffective in prevention of enlargement of the contact hole 19. A problem is caused when the underlying interlayer insulator is formed of SOG or the like. Namely, in such a case, the SOG which is exposed on the side face of the contact hole 19 is etched preferentially because SOG exhibits a greater etching rate than other oxide films. Consequently, the contact hole 19 after the treatment with the HF vapor exhibits local deformation at the portion where SOG exists, so that the embedded contact material, which is formed after the treatment, tends to be stepped or made discontinuous, resulting in a reduced coverage.

A technique referred to as a dry pre-processing method has also been proposed and discussed. In order to achieve etching anisotropy, it is important to introduce a certain degree of ion etching component into the etching process. However, high ion energy tends to damage silicon, in particular underlying shallow junctions, allowing an increase in junction leakage current. One of the effective measures for solving this problem is to effect an etching in such a manner as not to cause damage on the underlying substrate. It has also been proposed to conduct a soft-etching pre-processing by using a high-density plasma generated by, for example, an inductively coupled plasma (referred to as "ICP") device, in an inert gas atmosphere with or without introduction of a reactive gas. The mechanisms of these methods, however, are still unclear and, therefore, optimum conditions for achieving stable ohmic contacts have not yet been established. All these proposed methods are thus still unsatisfactory in that they cannot meet required levels of stability both in electrical characteristics and the yield of interconnects in the semiconductor devices. Under these circumstances, there is a strong demand for clarification of mechanisms and conditions for achieving stable ohmic contacts in order to obtain a wiring contact structure which can overcome the above-described problems, as well as a method for realizing such a wiring contact structure.

Besides the described pre-processing techniques conducted prior to the formation of the metal plug, it is also an effective technique to form an underlying contacting layer which underlies the conductive material to be embedded, e.g., a W-based material, in order to achieve a stable ohmic contact. For instance, a thick Ti layer as an underlying contacting layer deposited in a contact hole reduces and thus removes native oxide film on the Si so as to achieve a stable contact. However, too large a thickness of the underlying layer decreases the contact hole diameter available for embedding the W-based material such as a blanket tungsten, making it difficult to stably embed the blanket tungsten after the deposition of the underlying contact layer. A similar problem is caused also when the thickness of a titanium nitride (TiN) used as a barrier metal is large. These problems are attributable to the fact that optimum conditions for the underlying contacting layer and, hence, optimum blanket tungsten structure, have not yet been established.

SUMMARY OF THE INVENTION

Accordingly, it is an object of the present invention to provide a semiconductor device having such a stable wiring structure that realizes electrically stable ohmic contact even when the wiring density is extremely high, as well as a method for producing such a semiconductor device, thereby overcoming the above-described problems of the known art.

In accordance with the present invention, there is provided a semiconductor device having an interconnect, comprising: a semiconductor layer; an insulating film formed on the semiconductor layer and having a contact hole formed therein; a first contacting layer formed in the contact hole so as to be in contact with a surface of the semiconductor layer, the first contacting layer having a thickness of 4 nm or greater; and a contacting material formed on the first contacting layer so as to substantially fill the contact hole.

Preferably, the semiconductor device further comprises a second contacting layer formed between the first contacting layer and the contacting material, the second contacting layer having a thickness of 1 nm or greater.

The first contacting layer may be made of a material selected from the group consisting of a transition metal, a refractory metal and a silicide of a transition metal.

The contacting material may be selected from the group consisting of a refractory metal, a metal having a low melting point, a silicide of a transition metal, TiN, TiW, TiB, WN, ZrN and HfN.

The second contacting layer may be made of a material selected from the group consisting of a silicide of a transition metal, a transition metal, Ti, TiW, TiB, WN, ZrN and HfN.

The silicide of transition metal is preferably selected from the group consisting of $WSi_2$, $TiSi_2$, $CoSi_2$ and $NiSi_2$.

It is also preferred that the contacting material is a tungsten-based material formed by CVD technique.

Thus, the present invention provides an interconnect structure which offers a highly stable electrical contact and good barrier effect and a method of forming such an interconnect structure, as well as a semiconductor device having such an interconnect structure and a method of designing such an interconnect structure. A conventional interconnect structure employs a TiN/Ti layer as a contacting layer underlying, for example, a tungsten plug. Such an underlying contacting layer is formed typically by sputtering, involving a risk of reduction in coverage, thus causing a failure to produce at a high yield stable contact structures essential in next-generation semiconductor devices which are required to have highly fine contact holes. In particular, the above-mentioned interconnect structure suffers from a disadvantage in that an overhang is formed in the contact hole due to the presence of a thick TiN/Ti layer which is formed by sputtering for the purpose of achieving high electrical stability. Such an overhang makes it impossible to conformally build up a tungsten plug by CVD and allows voids to be generated in the tungsten, with the result that the reliability of the device is impaired. This problem is entirely derived from the fact that there still are unknown factors and questions in regard to controlling the thickness of the underlying contacting layer and the physical properties thereof.

In contrast, according to the present invention, it is possible to obtain stable electrical contacts and barrier characteristic and, through optimization of the thickness of an underlying layer, e.g., a contact layer, a stable interconnect structure without suffering from the generation of voids which hitherto has been inevitable when, for example, the metal plug in the contact hole is formed from tungsten by CVD.

The above and other objects, features and advantages of the present invention will become clear from the following description when the same is read in conjunction with the accompanying drawings.

DETAILED DESCRIPTION OF THE PREFERRED EMBODIMENTS

The present invention will be fully described hereunder with reference to the accompanying drawings.

Figure 1:
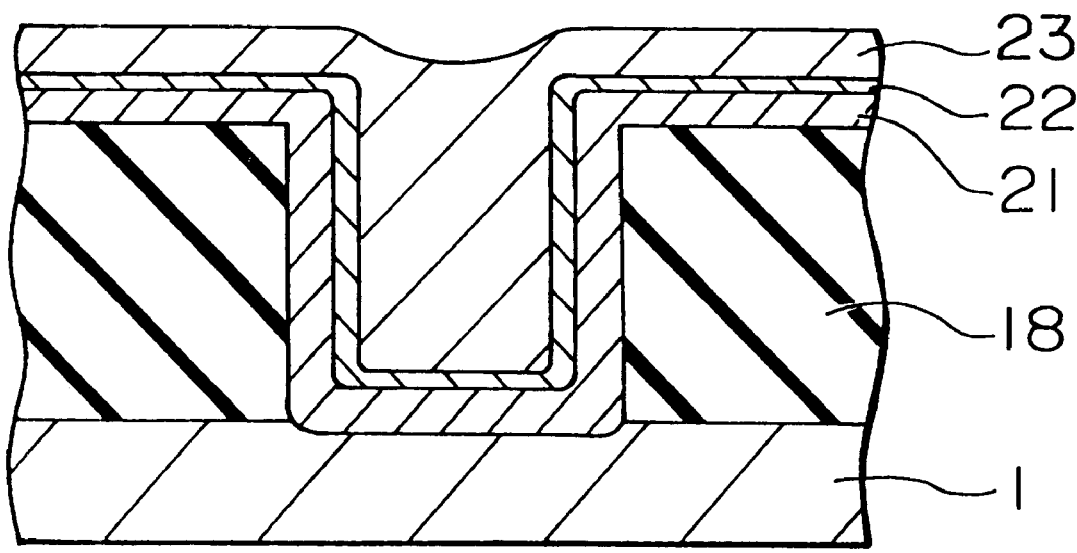
FIG. 1 is a fragmentary sectional view of a semiconductor device illustrative of a basic concept of the present invention.

The following description is focused mainly but not exclusively on an interconnect structure as shown in FIG. 1, where tungsten (W) is used as the material of the overlying metal plug 23 which is underlain by a dual underlying contacting layer composed of a first contact material layer 21 made of titanium (Ti) and a second contact material layer 22 formed of titanium nitride (TiN).

Figure 2:
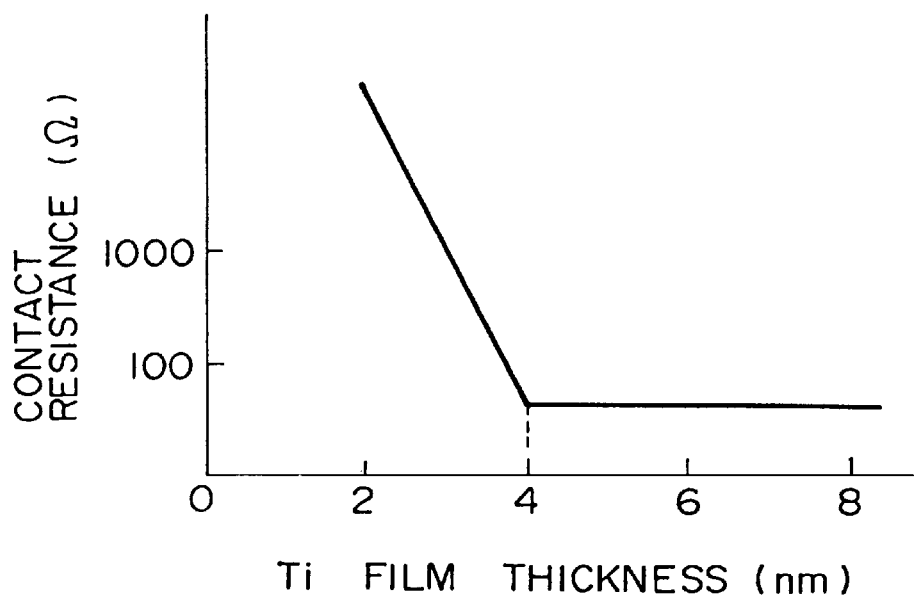
FIG. 2 is a graph showing the relationship between the thickness (mm) of a titanium film (Ti) as a layer underlying a tungsten plug (W) and contact resistance ($\Omega$) between the tungsten plug (W) and a silicon substrate (Si), which is indicative of an optimum range of the film thickness for stably achieving good ohmic contact.

A study was made to determine the relationship between the thickness of the first contact material layer (Ti) 21 in the contact hole and the level of contact resistance between the tungsten (w) plug 23 and the silicon (Si) substrate 1 as a semiconductor layer. The results are shown in FIG. 2. As will be seen from this Figure, it is understood that the minimum thickness of the Ti film must be 4 nm or greater in order to stably achieve a good state of ohmic contact. This range of thickness does not cause any impediment to stable formation of fine contact holes. The native oxide film on the Si substrate usually has a thickness ranging between 2 nm and 3 nm or so. It is considered that the thickness of the Ti film is about 4 nm or greater, in order that the native oxide film having such a thickness is reduced and removed. The foregoing discussion is based upon the assumptions that the pattern rule is 0.35 μm and the aspect ratio of the contact hole is 2.0.

Figure 3:
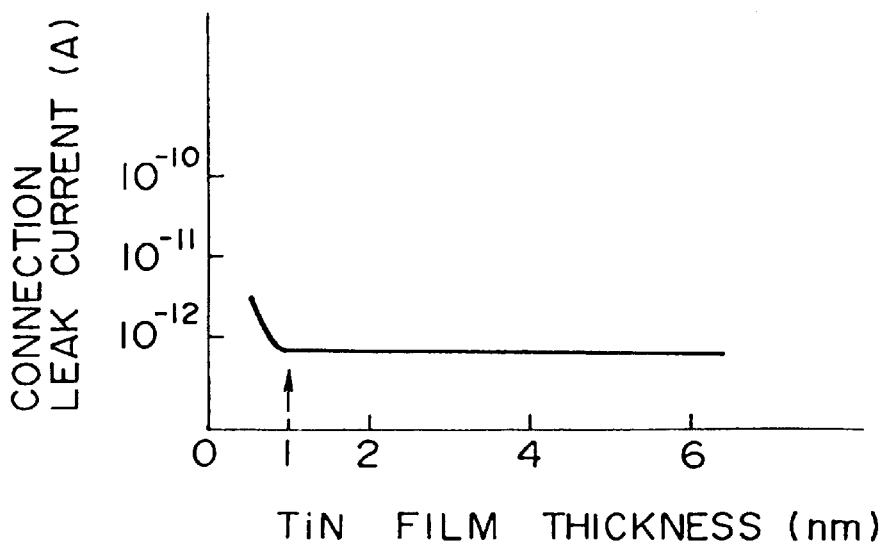
FIG. 3 is a graph showing the relationship between the thickness (mm) of a titanium nitride film (TiN) and junction leak current (A), which is indicative of an optimum range of the film thickness for minimizing the junction leak current.

A study was also made to determine the relationship between the thickness of the second contact material layer 22 of TiN underlying the W plug 23 and the junction leak current in order to find the optimum range of the thickness of the TiN film which minimizes the junction leak current. The relationship between the TiN film 22 and the level of the junction leak current thus determined is shown in FIG. 3. The W plug 23 is formed by a CVD process using, for example, $WF_6$ gas. The $WF_6$ gas tends to corrode the TiN film 22. From FIG. 3, it is understood that, in order to stably obtain a low level of junction leak current, the TiN film 22 must have a thickness of 1 nm or greater so that it may withstand the attack by the $WF_6$ gas. In order to ensure that any influence of the attack by the $WF_6$ gas is avoided despite small thickness of the TiN film, it is advisable to supply $SiH_4$ gas prior to the introduction of the $WF_6$ gas. The $SiH_4$ component adsorbed on the surface of the TiN film 22 effectively reduces any influence of the attack by the $WF_6$ gas, so as to ensure that a sufficient barrier effect is produced by the TiN film 22 even when the thickness of the latter is small.

First Embodiment

A description will now be given of a first embodiment of the present invention. An Si semiconductor device, more specifically, a MOS semiconductor device described as the first embodiment has an interconnect structure peculiar to the present invention. In this embodiment, a Ti film which is required to have a large thickness, i.e., a first contact material layer of 4 nm or thicker), is formed by using a collimator. The semiconductor device of the first embodiment employs an interconnect structure of the type described above in connection with FIG. 1.

Thus, the semiconductor device of the first embodiment comprises, as shown in FIG. 1, a semiconductor layer 1 which in this case is an Si substrate, a first contact material layer 21 which is in this case made of Ti and is in contact with the semiconductor layer 1, and a second contact material layer 22 which is in this case made of TiN and is in contact with the first contact material layer 21. Thus, the first contact material layer 21 is made of Ti, while the second contact material layer 22 is made of TiN. The Ti layer formed as the first contact material layer 21 has a thickness of 4 nm or greater, and the TiN layer formed as the second contact material layer has a thickness of 1 nm or greater.

The semiconductor device of the first embodiment has an interconnect structure which is designed in accordance with the design procedure of the present invention. Namely, the interconnect structure has the Ti layer serving as the first contact material layer 21 and formed in contact with the semiconductor layer 1, the TiN layer serving as the second contact material layer 22 and formed on the first contact material layer 21 in contact therewith, and the W layer serving as the overlying material layer 23 and formed on the second contact material layer 22 in contact therewith. In designing this structure, optimum values of the thicknesses of the layers of contact materials such as Ti, TiN and W were determined based on the pattern rule of 0.35 μm and the natures of these materials.

Methods of forming the contact material layers and the aspect ratio of the contact holes also are used as parameters in determining the thicknesses.

The first embodiment will be described in more detail hereinunder. An interconnect structure of a semiconductor device was manufactured through a process having the following steps (a) to (c).

Figure 4:
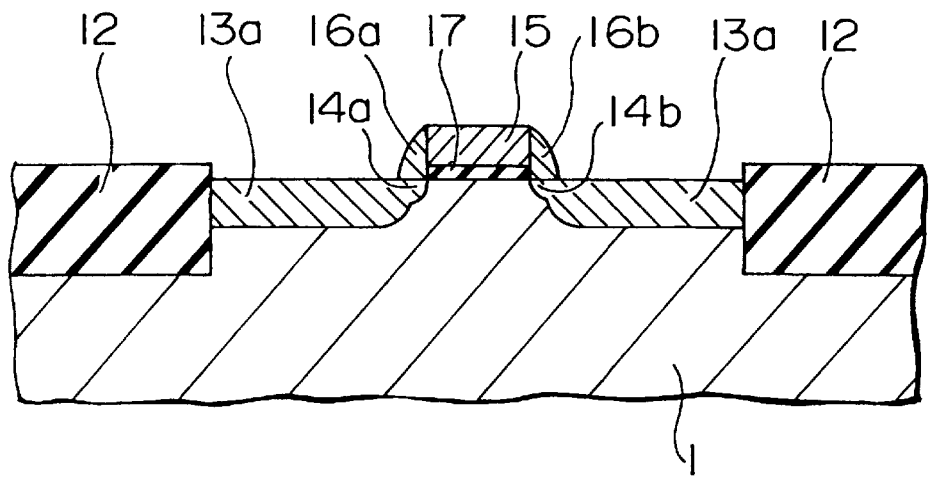
FIG. 4 is a sectional view of a structure obtained in the first step of a process for manufacturing a semiconductor device in accordance with a first embodiment of the present invention.

Step (a):

Referring to FIG. 4, a device isolation region 12 and a gate region 15, 17 are formed on an Si (100) substrate which constitutes a semiconductor layer 1. Then, an LDD region 14a, 14b is formed by an LDD ion implantation technique, followed by formation of an Si oxide film over the entire surface. This Step (a) is carried out under the following conditions.

Conditions:

Gas: $SiH_4/O_2/N_2$=250/250/100 sccm

Temperature: 420° C.

Pressure: 13.3 Pa

Film thickness: 0.25 μm

Then, an etch back treatment is conducted, followed by formation of a side wall 16a, 16b on the gate 15. This operation is conducted under the following conditions.

Conditions:

Gas: $C_4F_8$=50 sccm

RF power: 1200 W

Pressure: 2 Pa

Then, implantation of impurity ions is conducted to form source/drain regions 13a, 13b, under the following conditions, thus obtaining the structure as shown in FIG. 4:

Conditions:

N channel

As: 20 keV, $5e15/cm^2$

P channel $BF_2$: 20 keV, $3e15/cm^2$

Step (b):

Subsequently, an interlayer insulator 18 is formed. The formation of the interlayer insulator 18 begins with the formation of an oxide film by CVD using TEOS conducted under the following conditions.

Conditions:

Gas: TEOS=50 sccm

Pressure: 40 Pa

Temperature: 720° C.

Film thickness: 400 nm

Then, a film such as BPSG is formed under the following conditions, thus completing the interlayer insulator 18.

Conditions:

Gas: $SiH_4/PH_3/B_2H_6/O_2/N_2$=80/7/7/1000/32000 sccm

Temperature: 400° C.

Pressure: 101325 Pa

Film thickness: 500 nm

After a resist patterning, a contact hole 19 is formed by dry etching, under the following conditions:

Conditions:

Gas: $C_4F_8$=50 sccm

RF power: 1200 W

Pressure: 2 Pa

Then, contact ion implantation is executed under the following conditions, so as to form a junction region.

Conditions:

N channel

As: 20keV, 5e15/cm$^2$

P channel $BF_2$: 20keV, 3e15/cm$^2$

Figure 5:
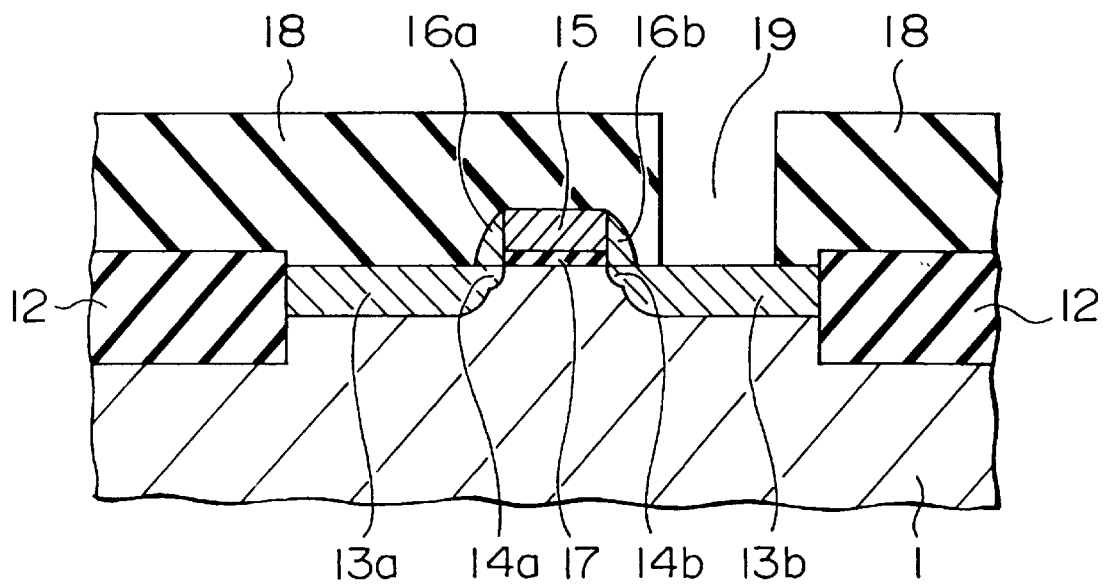
FIG. 5 is a sectional view of a structure obtained in the second step of the process for manufacturing the semiconductor device in accordance with the first embodiment of the present invention.

Subsequently, activating annealing is conducted for 5 seconds at 1050° C., whereby the structure as shown in FIG. 5 is obtained.

Step (c):

Embedding of a contact materials is then conducted. A Ti film 21 and a TiN film 22 are sequentially formed. The formation of the Ti film is performed by using a collimator.

Conditions for Forming Ti Film:

Power: 4 kW

Film forming temperature: 450° C.

Gas: Ar=100 sccm

Film thickness: 30 nm

Pressure: 0.47 Pa

The formation of the Ti film is conducted to achieve a film thickness of 4 nm. When the aspect ratio of the contact hole is 2, the Ti film can be obtained with a coverage of 10 to 15%, so that the film thickness of 4 nm is obtainable when the process is carried out under these conditions. It is considered that this Ti film is finally changed into silicide so as to form a $TiSi_2$ film of about 8 nm thick.

Conditions for Forming TiN Film:

Gas: $Ar/N_2$=40/70 sccm

Power: 5 kW

Pressure: 0.47 Pa

Film thickness: 10 nm

The TiN film is formed to have the thickness of 1 nm when these conditions are used. The coverage in this case is 10%.

Subsequently, the W film is formed by CVD technique. As the first step, $SiH_4$ gas is supplied under the following conditions, so that $SiH_4$ is adsorbed on the silicon substrate, i.e., on the semiconductor layer 1.

Conditions:

Gas: $SiH_4$=30 sccm

Temperature: 450° C.

Pressure: 10640 Pa

Then, W is formed by CVD under the following conditions.

Conditions:

Gas: $WF_6/H_2$=95/550 sccm

Temperature: 450° C.

Pressure: 10640 Pa

Figure 6:
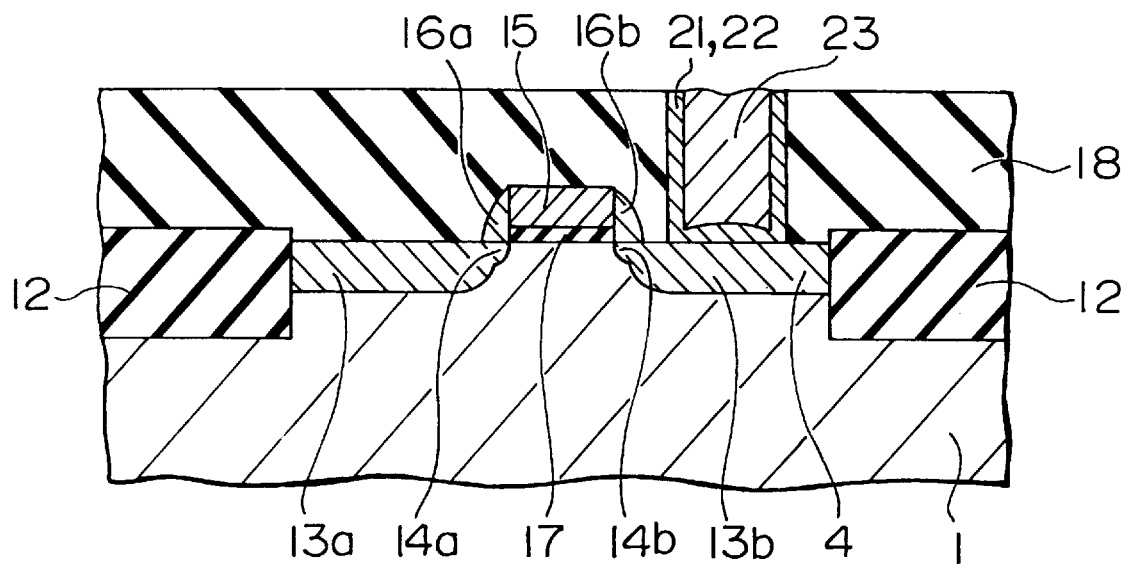
FIG. 6 is a sectional view of a structure obtained in the third step of the process for manufacturing the semiconductor device in accordance with the first embodiment.

Then, an etch back is carried out in accordance with the following conditions so as to embed W as the overlying wiring material 23 into the contact hole, whereby a structure as shown in FIG. 6 is obtained.

Conditions of Etch Back:

Gas: $SF_6$=50 sccm

Microwave power: 850 w

RF power: 150 W

Pressure: 1.33 Pa

A W/TiN/Ti contact structure is thus obtained through the Steps (a) to (c) described above. No defect is generated during formation and embedding of the W layer, by virtue of the small thickness of the TiN/Ti film.

Step (d):

An Al-Cu/Ti film is formed by sputtering. A Ti film 25 is first formed by sputtering conducted under the following conditions.

Conditions for Forming Ti Film:

Power: 4 kW

Forming temperature: 150° C.

Gas: Ar 100 sccm

Film thickness: 30 nm

Pressure: 0.47 Pa

An Al-Cu (1%) film 26 is then formed under the following conditions.

Power: 22.5 kW

Forming temperature: 150° C.

Gas: Ar=40 sccm

Film thickness: 500 nm

Pressure: 0.47 Pa

Figure 7:
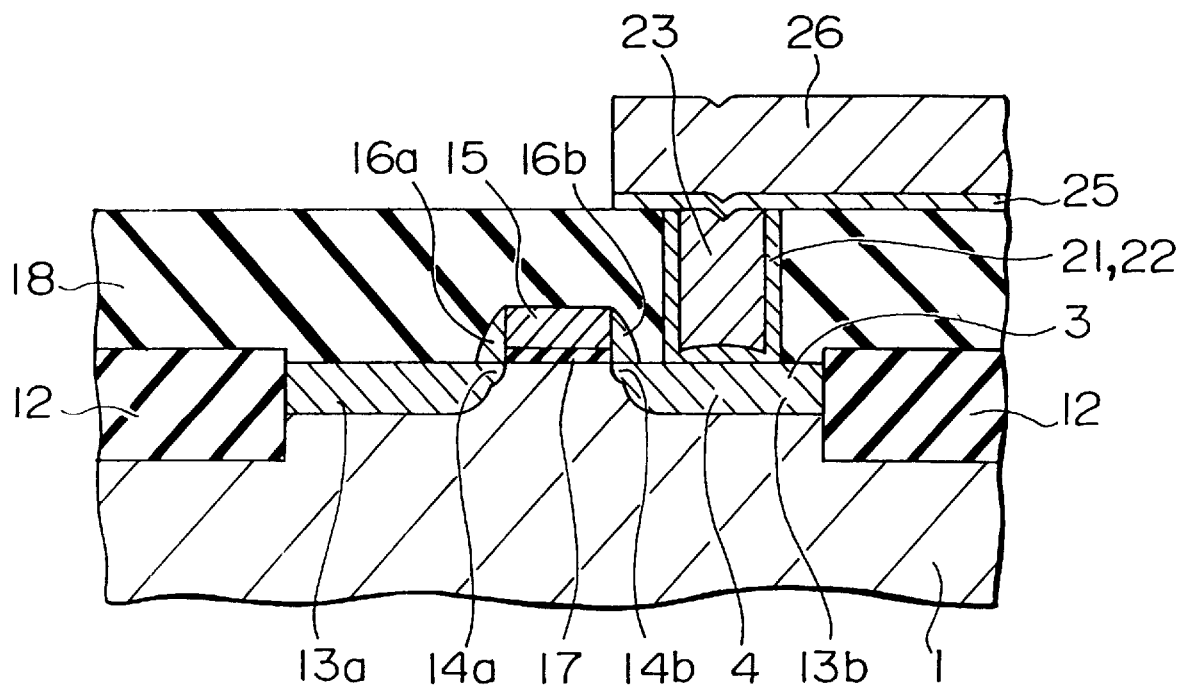
FIG. 7 is a sectional view of a structure obtained in the fourth step of the process for manufacturing the semiconductor device in accordance with the first embodiment.

Subsequently, resist patterning is conducted followed by dry etching, whereby the Al-Cu/Ti wiring layer is obtained, as shown in FIG. 7. The conditions are as follows.

Conditions:

Gas: $BCl_3/Cl_2$=60/90 sccm

Microwave power: 1000 w

RF power: 50 W

Pressure: 0.016 Pa

The described first embodiment offers the following advantages.

(1) Native oxide film inside the micro-fine contact hole can be completely removed, so that an ohmic junction can be obtained with a high degree of electrical stability.

(2) Development of devices in short turn around time (TAT), owing to the optimization of the semiconductor process.

(3) Increase in junction leak current is avoided, by virtue of the film thickness control to form a thin silicide film.

(4) Since the thickness of the underlying contact material layer is minimum and known, the formation of the blanket W subsequent to the formation of the underlying contact material layer can be done in a highly stable manner.

Second Embodiment

In the second embodiment of the present invention, the TiN/Ti underlying contacting material layer is formed by an electron cyclotron resonance CVD (referred to as "ECRCVD") technique. Thus, the second embodiment employs the following Step (c) in place of the Step (c) in the first embodiment. Other steps, i.e., Steps (a), (b) and (d) are materially the same as those of the first embodiment.

Step (c)

The TiN/Ti underlying contacting layer is formed by ECRCVD in accordance with the following conditions.

Conditions for Forming Ti Film:

Gas: $TiCl_4/H_2$=20/50 sccm

Forming temperature: 420° C.

Pressure: 0.13 Pa

Microwave power: 2.8 kW

Film thickness: 4 nm (Since CVD provides 100% coverage, this film thickness directly provides the bottomed film thickness)

Conditions for Forming TiN Film:

Gas: $TiCl_4/H_2/N_2=20/26/6$ sccm

Forming temperature: 420° C.

Pressure: 0.13 Pa

Microwave power: 2.8 kW

Film thickness: 1 nm

Deposition of W is then conducted by CVD. This is commenced with a supply of $SiH_4$ gas conducted under the following conditions.

Conditions:

Gas: $SiH_4$=30 sccm

Temperature: 450° C.

Pressure: 10640 Pa

The W film is then formed under the following conditions.

Conditions:

Gas: $WF_6/H_2$=95/550 sccm

Temperature: 450° C.

Pressure: 10640 Pa

Film thickness: 400 nm

Then, an etch back is carried out in accordance with the following conditions so as to form W only in the contact hole.

Conditions:

Gas: $SF_6$=50 sccm

Microwave power: 850 W

RF power: 150 W

Pressure: 1.33 Pa

A W/TiN/Ti contact structure is thus obtained. Since the TiN/Ti film formed as the underlying contacting material layer has an extremely small thickness, the reduction in the inside diameter of the contact hole is minimized, so that W can be embedded without being accompanied by any defect during the formation of the blanket W.

The second embodiment offers the same advantages as those produced by the first embodiment.

Third Embodiment

In order to further stabilize the formation of ohmic contact, in the third embodiment of the present invention, a Ti film of 4 nm thick is formed over the entire area, in advance of the formation of the interlayer insulator, and the structure is heated up to a temperature at which Ti reacts with Si. A contact hole is formed after removal of Ti from $SiO_2$ film, followed by formation of a TiN film and subsequent embedding of W.

Thus, the third employs the following Steps (b) to (d) in place of Steps (b) to (d) of the first embodiment.

Figure 8:
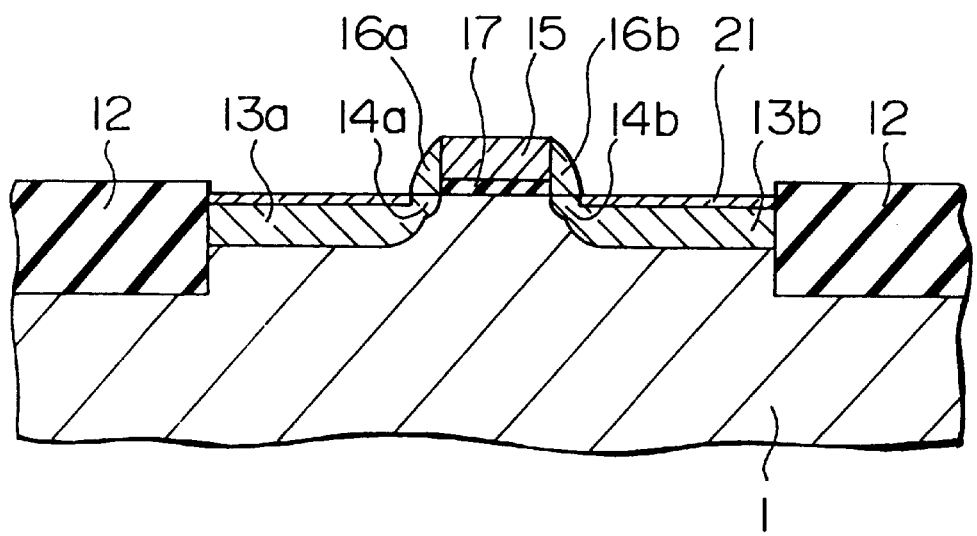
FIG. 8 is a sectional view of a structure obtained in the first step of a process for manufacturing a semiconductor device in accordance with a third embodiment of the present invention.

Step (b):

A thin Ti film is formed. More specifically, as shown in FIG. 8, a Ti film of 4 nm, which constitutes the contacting material layer 21, is formed by ECRCVD technique which excels in controllability, in accordance with the following conditions.

Conditions for Forming Ti Film:

Gas: $TiCl_4/H_2$=20/50 sccm

Forming temperature: 420° C.

Pressure: 0.13 Pa

Microwave power: 2.8 kW

Film thickness: 4 nm

After the formation of the Ti film, a heat treatment is conducted at about 600° C., while the supply of the gases is stopped.

Conditions of Heat Treatment:

Gas: 4 liters/min.

Temperature: 600° C.

Time period: 30 seconds

Figure 9:
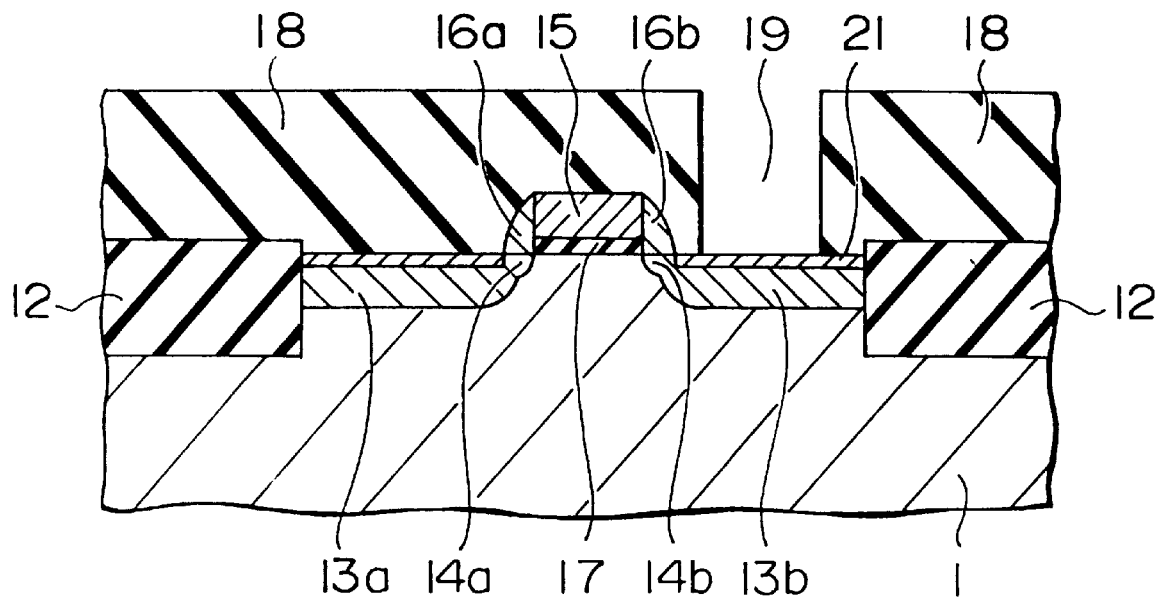
FIG. 9 is a sectional view of a structure obtained in the second step of the process for manufacturing the semiconductor device in accordance with the third embodiment.

Then, the entire surface is dipped in an ammonia perhydrate mixture liquid for 10 minutes so that the Ti film on $SiO_2$ is selectively removed, whereby a structure with the contacting material layer 21 changed to silicide (TiSi2) is obtained as shown in FIG. 9.

Step (c):

An interlayer insulator is then formed. To this end, an oxide film is formed first by, for example, CVD by using TEOS, in accordance with the following conditions.

Conditions:

Gas: TEOS=50 sccm

Pressure: 40 Pa

Temperature: 720° C.

Film thickness: 400 nm

Then, a film such as of BPSG is formed under the following conditions, thus completing the interlayer insulator.

Conditions:

Gas: $SiH_4/PH_3/B_2H_6/O_2/N_2$=80/7/7/1000/32000 sccm

Temperature: 400° C.

Pressure: 101325 Pa

Film thickness: 500 nm

Then, a resist patterning is conducted followed by a dry etching, thereby forming a contact hole, in accordance with the following conditions.

Conditions:

Gas: $C_4F_8$=50 sccm

RF power: 1200 W

Pressure: 2 Pa

Then, a contact ion implantation is conducted in accordance with the following conditions, thereby forming a junction region.

Example of Conditions:

N channel

As: 20 keV, $5e15/cm^2$

P channel $BF_2$: 20 keV, $3e15/cm^2$

Then, an activating annealing is conducted at 1050° C. for 5 seconds, whereby a structure is obtained in which a contact hole 19 is formed in the interlayer insulator 18, as shown in FIG. 9.

Step (d):

Then, embedding of the contact metal is conducted. A TiN film is formed first in accordance with the following conditions.

Example of Conditions for Forming TiN Film:

Gas: $Ar/N_2$=40/70 sccm

Power: 5 kW

Pressure: 0.47 Pa

Film thickness: 10 nm (bottom film thickness 1 nm at 10% coverage)

Subsequently, W is deposited by CVD, following a supply of $SiH_4$ gas conducted under the following conditions.

Gas: $SiH_4$=30 sccm

Temperature: 450° C.

Pressure: 10640 Pa

Then, deposition of W is conducted in accordance with the following conditions.

Conditions:

Gas: $WF_6/H_2$=95/550 sccm

Temperature: 450° C.

Pressure: 10640 Pa

Film thickness: 400 nm

An etch back is then conducted to form W only in the contact hole, in accordance with the following conditions.

Figure 10:
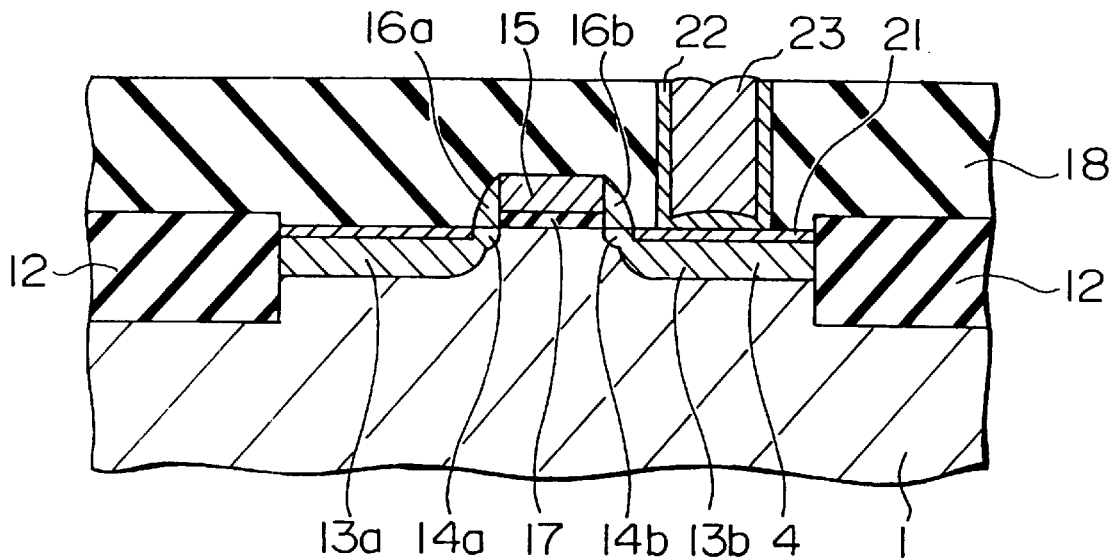
FIG. 10 is a sectional view of a structure obtained in the third step of the process for manufacturing the semiconductor device in accordance with the third embodiment.

Conditions:
  Gas: $SF_6$=50 sccm
  Microwave power: 850 W
  RF power: 150 W
  Pressure: 1.33 Pa An overlying contacting layer 23 of W is thus formed, whereby a W/TiN/Ti contact structure is obtained as shown in FIG. 10. It is to be understood that the embedding of W can be performed without any defect, because the thickness of the TiN/Ti layer is sufficiently small.

Step (e)

An Al-Cu/Ti layer is formed by sputtering. A Ti film 25 is formed first in accordance with the following conditions.

Figure 11:
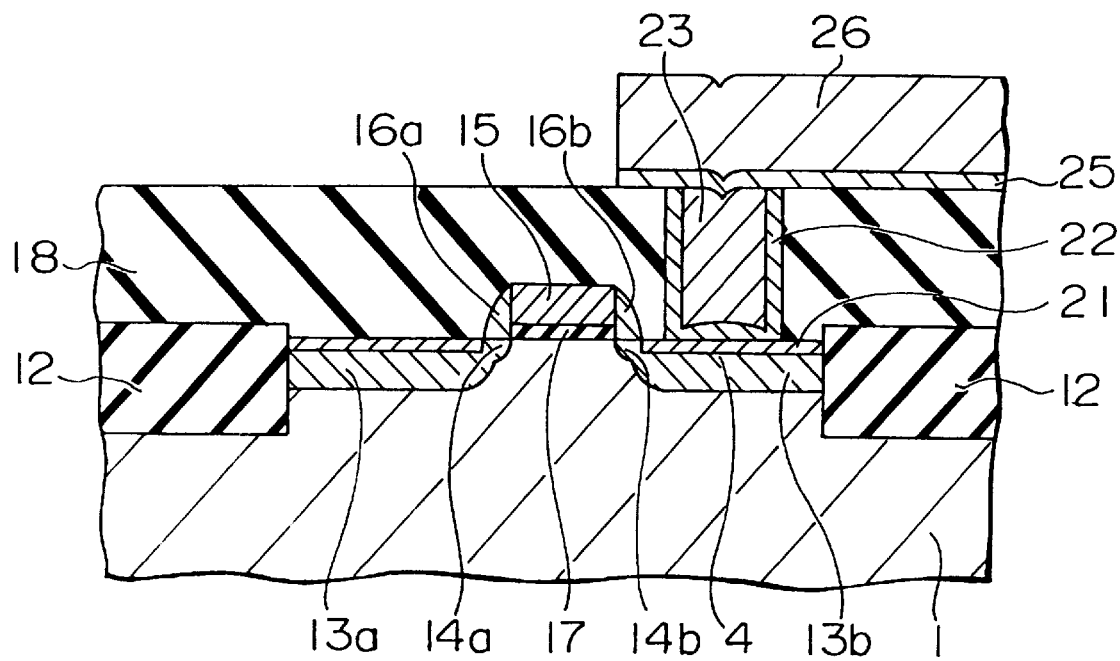
FIG. 11 is a sectional view of a structure obtained in the fourth step of the process for manufacturing the semiconductor device in accordance with the third embodiment.
Figure 12:
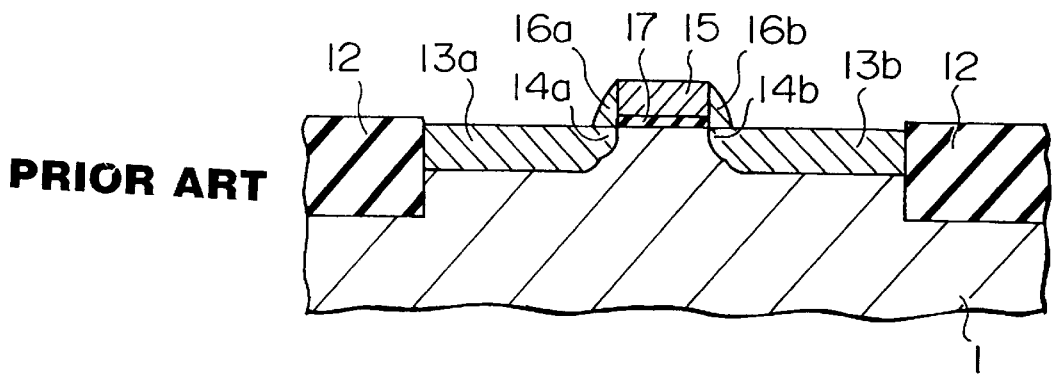
FIG. 12 is a sectional view of a structure obtained in the first step of a process for manufacturing a MOSFET.
Figure 13:
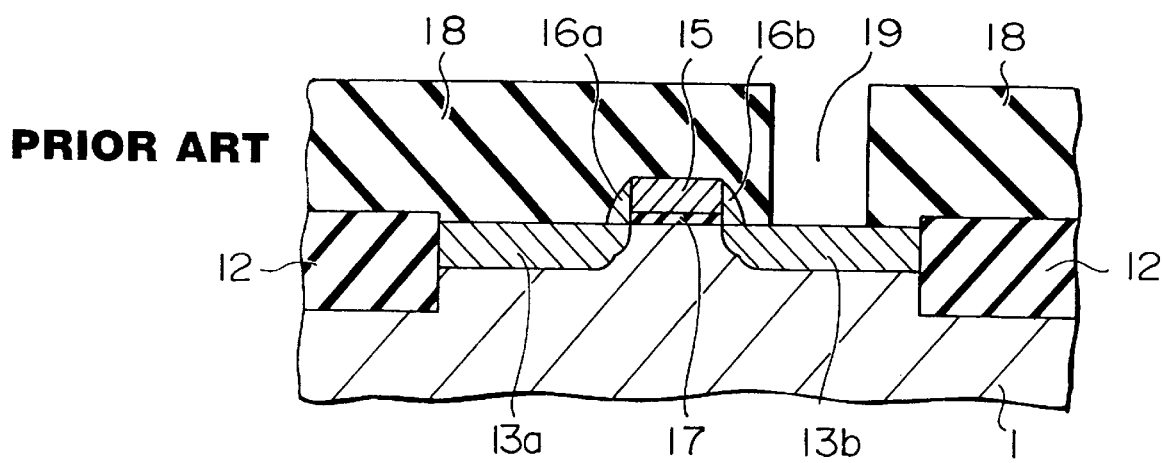
FIG. 13 is a sectional view of a structure obtained in the second step of the process for manufacturing the MOSFET.
Figure 14:
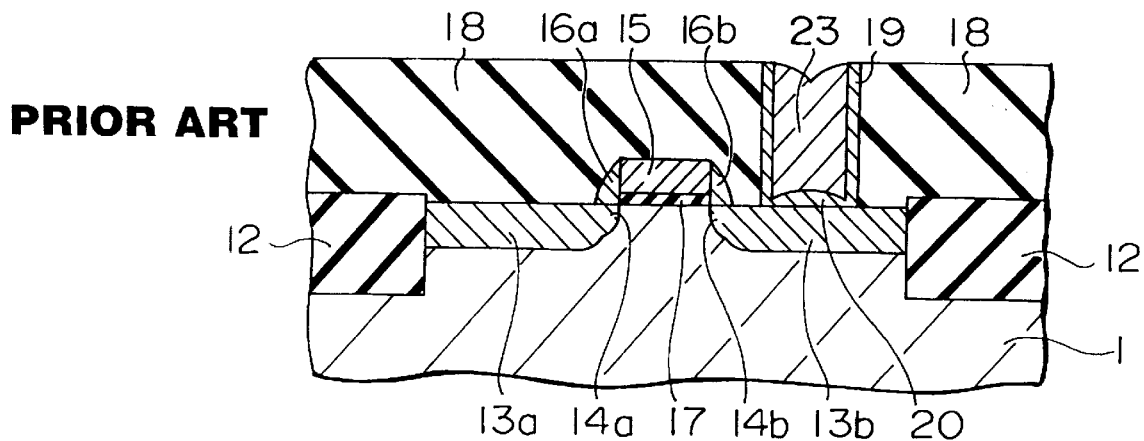
FIG. 14 is a sectional view of a structure obtained in the third step of the process for manufacturing the MOSFET.

Example of Conditions of Formation of Ti Film:
  Power: 4 kW
  Forming temperature: 150° C.
  Gas: Ar=100 sccm
  Film thickness: 30 nm
  Pressure: 0.47 Pa Then, an Al-Cu (1%) film 26 is formed in accordance with the following conditions.
  Power: 22.5 kW
  Forming temperature: 150° C.
  Gas: Ar=40 sccm
  Film thickness: 500 nm
  Pressure: 0.47 Pa Then, a resist patterning and a dry etching are executed, whereby an Al-Cu/Ti wiring layer is formed as shown in FIG. 11.

Conditions:
  Gas: $BCl_3/cl_2$=60/90 sccm
  Microwave power: 1000 w
  RF power: 50 W
  Pressure: 0.016 Pa Although preferred embodiments have been described, it is to be understood that these embodiments are only illustrative and the present invention may be carried out in various other methods or processes which can achieve the aforesaid object of the invention. It is also to be noted that the invention can be applied to various types of semiconductor devices such as bipolar transistors, CCDs and so forth, although MOS devices have been specifically mentioned in the foregoing description.

What is claimed is:

1. A process for fabricating a semiconductor device having an interconnect, comprising the steps of:
  forming a semiconductor layer;
  depositing an insulating film on said semiconductor layer;
  forming a contact hole in said insulating film;
  depositing approximately 4 nm of a first contacting layer in said contact hole so as to be in contact with a surface of said semiconductor layer;
  depositing approximately 1 nm of a second contacting layer in said contact hole so as to be in contact with a surface of said first contacting layer; and
  forming a contacting material on said second contacting layer so as to substantially fill said contact hole, wherein said step of forming said contact hole comprises the step of forming said contact hole to have an aspect ratio of about 2.0, thereby enabling said first contacting layer to have a thickness of approximately 4 nm.

2. The method as set forth in claim 1, wherein said step of forming said contact hole comprises the step of forming said contact hole to have an aspect ratio of 2.0, thereby enabling said first contacting layer to have a thickness of approximately 4 nm.

3. The method as set forth in claim 1, wherein said step of forming said contacting material comprises the steps of subjecting said second contacting layer to $SiH_4$ gas and then forming said contacting material by chemical vapor deposition using $WF_6$.

4. The method as set forth in claim 1, wherein said step of depositing said first contacting layer comprises the step of depositing said first contacting layer by chemical vapor deposition.

5. The method as set forth in claim 1, further comprising a step of changing said first contacting layer into silicide to form a film having a thickness of approximately 8 nm.

6. The method as set forth in claim 1, wherein said step of depositing said first contacting layer comprises the step of depositing said first contacting layer selected from the group consisting of a transition metal, a refractory metal, and a silicide of a transition metal.

7. The method as set forth in claim 1, wherein said step of depositing said second contacting layer comprises the step of depositing said second contacting layer selected from the group consisting of a silicide of a transition metal, a transition metal, Ti, TiW, TiB, WN, ZrN, and HfN.

8. The method as set forth in claim 1, wherein said step of forming said contacting material comprises the step of forming said contacting material selected from the group consisting of a refractory metal, a metal having a low melting point, a silicide of a transition metal, TiN, TiW, TiB, WN, ZrN, and HfN.

9. The method as set forth in claim 1, wherein said steps of depositing said first and second contacting layers are performed by electron cyclotron resonance chemical vapor deposition.

10. The method as set forth in claim 1, wherein said step of depositing said first contacting layer is performed prior to said step of depositing said insulating film.

11. The method as set forth in claim 10, further comprising the steps of heating said first contacting layer and applying an ammonia perhydrate mixture to said first contacting layer.

12. A process for fabricating a semiconductor device having an interconnect, comprising the steps of:
  forming a semiconductor layer;
  depositing approximately 4 nm of a first contacting layer in contact with a surface of said semiconductor layer;
  depositing an insulating film on said first contacting layer;
  forming a contact hole in said insulating film;
  depositing approximately 1 nm of a second contacting layer in said contact hole; and
  forming a contacting material on said second contacting layer so as to substantially fill said contact hole, wherein said step of forming said contact hole comprises the step of forming said contact hole to have an aspect ratio of about 2.0, thereby enabling said second contacting layer to have a thickness of approximately 1 nm.

13. The method as set forth in claim 12, further comprising:
  annealing said first contacting layer to be silicide after the step of depositing said first contacting layer.

* * * * *